(12) United States Patent  
Herrera et al.

(10) Patent No.: US 11,043,858 B2  
(45) Date of Patent: *Jun. 22, 2021

(54) HIGH EFFICIENCY POWER GENERATION SYSTEM AND A METHOD OF OPERATING SAME

(71) Applicant: A&I Power Group Inc., Wilmington, DE (US)

(72) Inventors: Alexis Herrera, Dubai (AE); Iyad Baghdane, Dubai (AE)

(73) Assignee: A&I Power Group Inc., Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 16/985,776

(22) Filed: Aug. 5, 2020

(65) Prior Publication Data

US 2020/0366142 A1   Nov. 19, 2020

Related U.S. Application Data

(63) Continuation of application No. 16/689,827, filed on Nov. 20, 2019, now Pat. No. 10,770,937.

(Continued)

(51) Int. Cl.  
*H02K 1/27* (2006.01)  
*G01R 33/038* (2006.01)  
(Continued)

(52) U.S. Cl.  
CPC .......... *H02K 1/27* (2013.01); *G01R 33/0385* (2013.01); *H01F 7/13* (2013.01); *H01F 7/1607* (2013.01); *H01F 41/0253* (2013.01)

(58) Field of Classification Search  
CPC ..... H02K 1/27; H02K 17/165; G01R 33/0385  
See application file for complete search history.

(56) References Cited

U.S. PATENT DOCUMENTS 5,350,991 A   9/1994  Bae  
5,386,186 A   1/1995  Gritter  
(Continued)

FOREIGN PATENT DOCUMENTS

WO       2018122098       7/2018

OTHER PUBLICATIONS

Electromagnetic Induction, AC Circuits, and Electrical Technology, Chapter 23, pp. 813-820.

(Continued)

*Primary Examiner* — Cortez M Cook  
(74) *Attorney, Agent, or Firm* — Boyle Fredrickson, S.C.

(57) ABSTRACT

A power generating system using magnetic induction and a method of operating same are disclosed. The power generating system includes at least one stationary electromagnet receiving an excitation voltage from a power supply. The at least one stationary electromagnet has a north pole, a south pole and a magnetic field. The system also includes at least one stationary coil positioned inside the magnetic field and intersected by magnetic field lines of the at least one electromagnet such that when the at least one electromagnet is excited, an electromotive force (EMF) is induced in the at least one stationary coil. The power supplied may be AC or DC. The system also includes a frequency modulator for changing the rate of electric current introduced to the at least one electromagnet so that the change of current rate will cause an EMF to be induced in the coil.

12 Claims, 13 Drawing Sheets

Related U.S. Application Data

(60) Provisional application No. 62/787,975, filed on Jan. 3, 2019.

(51) Int. Cl.
  *H01F 7/13* (2006.01)
  *H01F 7/16* (2006.01)
  *H01F 41/02* (2006.01)

(56) References Cited

U.S. PATENT DOCUMENTS

| | | | | |
|---|---|---|---|---|
| 5,416,391 | A | * | 5/1995 | Correa .................. H01J 17/063 |
| | | | | 307/106 |
| 5,886,443 | A | * | 3/1999 | Dymond .............. H02K 17/165 |
| | | | | 310/196 |
| 6,137,391 | A | | 10/2000 | Mitamura et al. |
| 6,710,495 | B2 | | 3/2004 | Lipo et al. |
| 7,830,056 | B2 | | 11/2010 | Barada et al. |
| 8,674,273 | B2 | | 3/2014 | Yonenaga et al. |
| 2005/0030136 | A1 | | 2/2005 | Babich |
| 2010/0259208 | A1 | | 10/2010 | Hao et al. |
| 2014/0354119 | A1 | * | 12/2014 | Shishido .................. H02K 3/18 |
| | | | | 310/68 B |
| 2015/0137647 | A1 | * | 5/2015 | Hunstable .............. H02K 21/22 |
| | | | | 310/156.43 |
| 2015/0171694 | A1 | * | 6/2015 | Walsh ...................... H02K 3/47 |
| | | | | 310/156.43 |
| 2015/0244220 | A1 | * | 8/2015 | Yost .......................... F03D 9/25 |
| | | | | 310/156.12 |
| 2016/0011282 | A1 | | 1/2016 | Higaki et al. |

OTHER PUBLICATIONS

Liu M., Sun N. X., "Voltage control of magnetism in multiferroic heterostructures", Phil. Trans. R. Soc. A 372, 20120439, 2014.

Written Opinion of the International Searching Authority, PCT/IB2020/050004, dated Apr. 2, 2020.

International Preliminary Report on Patentability, PCT/IB2020/050004, dated Aug. 19, 2020.

* cited by examiner

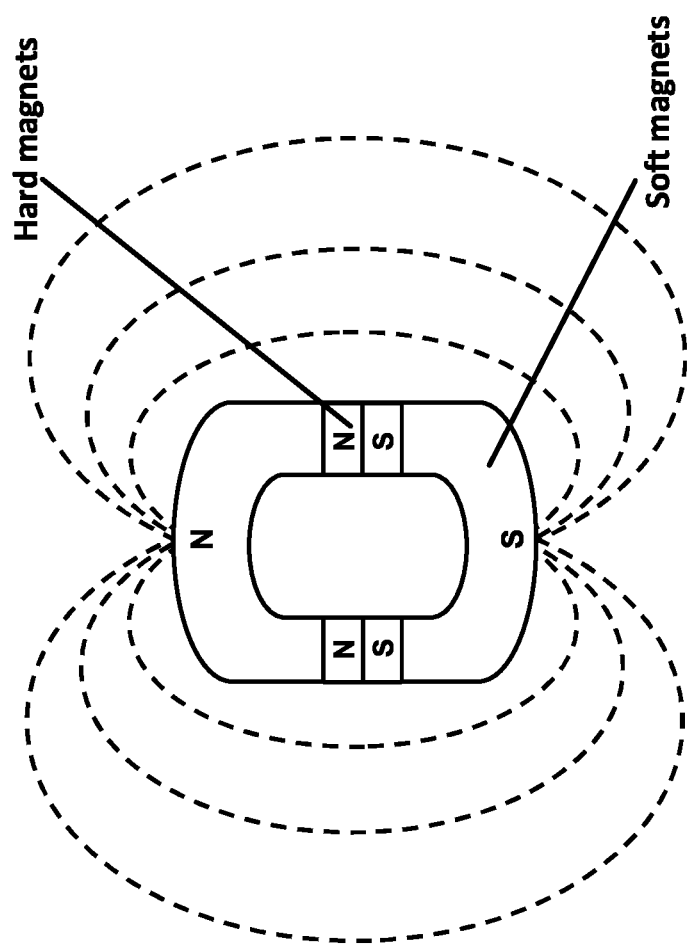
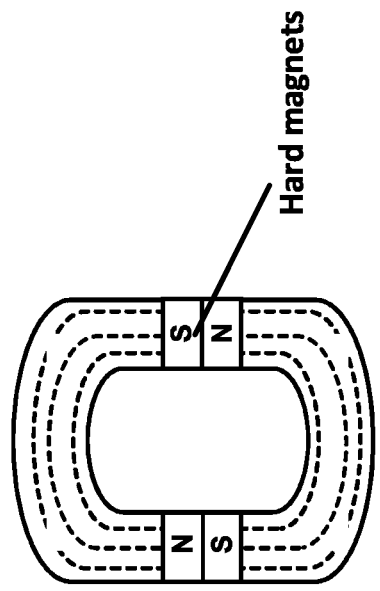
FIG. 11A
FIG. 11B

HIGH EFFICIENCY POWER GENERATION SYSTEM AND A METHOD OF OPERATING SAME

CROSS-REFERENCE TO RELATED APPLICATIONS

This application is a continuation application of U.S. Non-Provisional patent application Ser. No. 16/689,827 entitled "A High Efficiency Power Generation System and a Method of Operating Same" and filed on 20 Nov. 2019, which claims priority from U.S. Provisional Patent Application No. 62/787,975 entitled "A High Efficiency Power Generation System and a Method of Operating Same" and filed on 3 Jan. 2019, the entirety of which are hereby incorporated by reference.

TECHNICAL FIELD

This invention relates generally to power generation system and more particularly, to high efficiency power generating system using induction and a method of operating same.

BACKGROUND

Current technology used in electric power plants to produce electricity usually utilizes a fuel source, such as coal, oil, natural gas, nuclear, or solar energy to produce electricity. In a combined cycle power plant, Hydrocarbons are used to create heat. The heat is used to boil water to create steam, the steam under high pressure is used to spin a turbine, which in turn spins a shaft that is connected to a rotor on which an electromagnet (or permanent magnet) is located. The rotor is surrounded by stationary coils (stators). In some cases, wind power or falling water may be used to spin the turbine. In a simple cycle power plant, as hot combustion gas expands through the turbine, it spins the rotating blades. The rotating blades spin a generator to produce electricity.

The electromagnet is usually powered by a DC voltage to generate its magnetic field. The rotation of the rotor and therefore that of the electromagnet via the shaft causes the magnetic field lines of the electromagnet to cross the stationary coils (stators). This results in an alternating current being induced in the wire of the coils (stators) subject to Faraday's law. The faster the electromagnet is rotated (and hence with it the magnetic field lines), the greater the induced current in the stators. FIG. 1 shows a stationary coil in proximity to a magnet that is rotated by a rotating shaft. The magnetic field lines are presented in FIG. 1 in dashed lines. As the electromagnet rotates, the magnetic field lines rotate with it and this causes the lines to cross the stationary coil. This in effect generates an electromotive force (emf) or a potential across the coil. In FIG. 1, this is represented by $V_{emf}$ as a function of time.

Faraday's law may also be applied in an alternative arrangement, in which a wire loop is rotated between two stationary magnets and a crank is used to cause this rotation. This produces a continuous varying voltage, which in turn produces an alternating current subject to Faraday's law. The faster the crank turns, the more current is generated.

In the system setup described above, the components that causes the shaft rotation are involved and have high maintenance costs. Additionally, the operability and efficiency of the system is linked to the proper operation of many parts of this system, including the boiler, turbine, shaft and any of their couplings. Further, due to the mechanical movement of the shaft that leads to the rotational movement of the rotor and that of the magnet and/or the coils (depending on the setup), a substantial amount of energy is lost in the system due to heat and friction. In fact, it is estimated that the efficiency of power plant generators that utilize the traditional setup described above does not exceed 60%. Moreover, the fuel sources that are used to generate the mechanical energy needed for the rotation of the shaft negatively affects the environment. As such, a new energy generation system is desired to increase the efficiency of power generation and that also overcomes these deficiencies.

SUMMARY OF THE INVENTION

The current invention has several aspects. In one aspect of the invention, an induction power generating system is described. The system includes at least one stationary electromagnet receiving an excitation voltage from a power supply, where the at least one stationary magnet has a north pole, a south pole and a magnetic field. The system also includes at least one stationary coil positioned inside the magnetic field and intersected by magnetic field lines of the magnetic field. In some embodiments, the at least one stationary coil is external to and in close proximity of at least one of the north pole and south pole of the at least one stationary electromagnet. In other embodiments, the electromagnet is a hollow solenoid and the at least one stationary coil is positioned inside the electromagnet. In the system, the power supply is configured for modifying a rate of change of an electrical current supplied from the power supply to the at least one stationary electromagnet, such that when the at least one stationary electromagnet is excited by the power supply, an electromotive force (EMF) is induced in the at least one stationary coil.

In a related embodiment, the system further includes a modulator for modifying the rate of change of the electrical current supplied from the power supply to the at least one stationary electromagnet, such that when the at least one stationary electromagnet is excited by the modulator controlled power supply, an electromotive force (EMF) is induced in the at least one stationary coil generating an induced current. The modulator may be used to modify the rate of change of the electrical current by applying to an electrical current signal of the power supply one or more modulation signals including pulse waves, square waves, triangular waves, triangular pulses, sinusoidal waves and sawtooth waves.

In yet another related embodiment, the at least one stationary electromagnet comprises two or more electromagnets and such that external to and in close proximity of each pole of the two or more electromagnets is at least one stational coil.

In some embodiments, the power supply may be an AC or DC voltage power supply. In other embodiments, the stationary coil is configured such that an angle between magnetic field lines of the electromagnet and the normal direction to the surface of the at least one stationary coil intersected by the magnetic field lines is zero. This allows for maximizing the surface area exposed to the magnetic field lines and for maintaining such configuration in position for all times.

In some embodiments, where the intention is to maximize the harvesting of the potential energy stored in the magnetic field of the electromagnet in the system, the electromagnet may be configured such that the north pole and the south pole are shaped to maximize their surface areas while maintaining a space separating the north and south pole.

Examples of such shapes are sphere or box shaped but it is understood that other shapes are contemplated within the scope of this invention. In order to prevent magnetic field lines from passing from the north pole to the south pole within the space between the poles, the space between the poles is filled with material with characteristics to prevent magnetic field lines to move from the north pole to the south pole in such space. In this embodiment, the at least one stationary coil would include a series of coils positioned adjacent to one another to cover the entire surface area of at least one of the north and south poles. In some related embodiments, the material used to separate the two poles may be made from non-magnetic material. In other related embodiments, the material may be made using Voltage Controlled Magnetism (VCM). In such embodiments, an externally powered modulator may be used to apply modulated electrical current to the VCM layer which causes the polarity of the VCM to be switched hence preventing the magnetic field lines from passing through the VCM layer and forcing them to pass from the north pole to the south pole external to the surface to their surface area. This in turn allows the magnetic field lines to cross the stationary coils that are positioned external to either or both of the north and south poles.

In another related embodiment, the induction generator system may further comprising a thin VCM layer positioned between the at least one stationary electromagnet and the at least one stationary coil. In some embodiments, where the stator is external to the electromagnet, the at least one stationary coil is positioned close to the VCM layer, which is positioned closed to at least one of the north and south poles and the at least one stationary coil is positioned external to and in close proximity to either or both of the poles. In embodiments, where the stator is positioned inside the electromagnet, the VCM layer is positioned between the at least one stationary electromagnet and the at least one stational coil of the stator. The thin VCM layer in either of these configurations may be powered by its own power source. When enough power is supplied, the magnetic polarity in the VCM layer is reversed. This causes the VCM layer to block the magnetic field lines from passing from the electromagnet poles to the coils external to the poles. In some embodiments, a modulator is used to modulate the duration of the current supplied by the VCM power supply so as to control the duration of reverse polarity. This in effect creates an on-off-on mechanism of the magnetic field passing through the coils external to the electromagnet, which in turn induces EMF and current in the external coils.

In other embodiments, the electromagnet in induction generator system may be an ElectroPermanent Magnet (EPM) comprising a hard magnet section and a soft magnet section. The system may further include a second power supply for applying a current to only one section of the hard magnet section of the EPM to reverse magnetic polarity of that section of the hard magnet. By reversing the polarity in that section of the hard magnet, this causes the magnetic field lines external to the electromagnet to disappear as the magnetic field lines will only flow internal in the magnetic material in a cycle going from south pole to the north pole as a result of the polarity change in the one section of the hard magnet part of the electro magnet. However, when the polarity is reversed again so that the two hard magnet sections have the same polarity, this causes the magnetic field lines to flow from the north pole to the south pole externally to the electromagnet and thereby crossing the coils external to the electromagnet. In some related embodiments, the system is equipped with a modulator configured for controlling the frequency and duration of the current of the second power source thereby controlling the frequency of reversing the magnetic polarity of the only one section of the hard magnetic section. This in effect simulate the change of magnetic flux and magnetic field across the coils positioned external to the north and south poles of the electromagnet, which ultimately induces EMF and current in the coil.

Another aspect of the invention relates to a method of generating electricity using magnetic induction, the method includes: powering a stationary electromagnet using a power supply; modifying a rate of change of an electrical current supplied from the power supply to the electromagnet; and inducing an electrical current on at least one stationary coil positioned within a magnetic field of the electromagnet and intersected by magnetic field lines of the magnetic field, where induction occurs when the at least one electromagnet is excited by the power supply. This method may be applied using any of the systems described above and in this disclosure.

Another aspect of the invention relates to a method of modifying a traditional induction generator to increase output efficiency, the method includes: fixing a rotor and an electromagnet therein of the traditional induction generator stationary in relation to a stator of the traditional induction generator. The method also includes disabling any rotational movement of the rotor and removing any system component contributing to such movement. This means that the rotating shaft that is traditionally used to rotate the shaft may be removed completely from the system as its functionality will no longer be required. Without the rotating shaft, the turbine and all mechanism required to move the turbine will also be eliminated from the system. The method further includes the step of applying a modulated current to an electromagnet on the stationary rotor such that there is a rapid rate of change in the modulated electrical current supplied to the electromagnet. Finally, the method includes the step of inducing an Electromotive force (EMF) and a current on windings of the stator due to the rapid rate of change of the electrical current. The result of this modification to the traditional induction system is the increased efficiency of the induction generator due to eliminating the need for the mechanical movements of the shaft and turbine while at the same time maintaining the ability to induce EMF and current in the stator windings. The energy loss is reduced significantly by eliminating all the mechanical requirements, which in turn results in the increase of efficiency in the system.

Other aspects and embodiments of the invention will be apparent as will be shown in the detailed description of the invention.

BRIEF DESCRIPTION OF THE DRAWINGS

The accompanying drawings illustrate non-limiting example embodiments of the invention.

FIGS. 11A and 11B shows a schematic diagram showing the behaviour of magnetic field lines in a PEM in the ON and OFF configurations, respectively.

DETAILED DESCRIPTION

Figure 1:
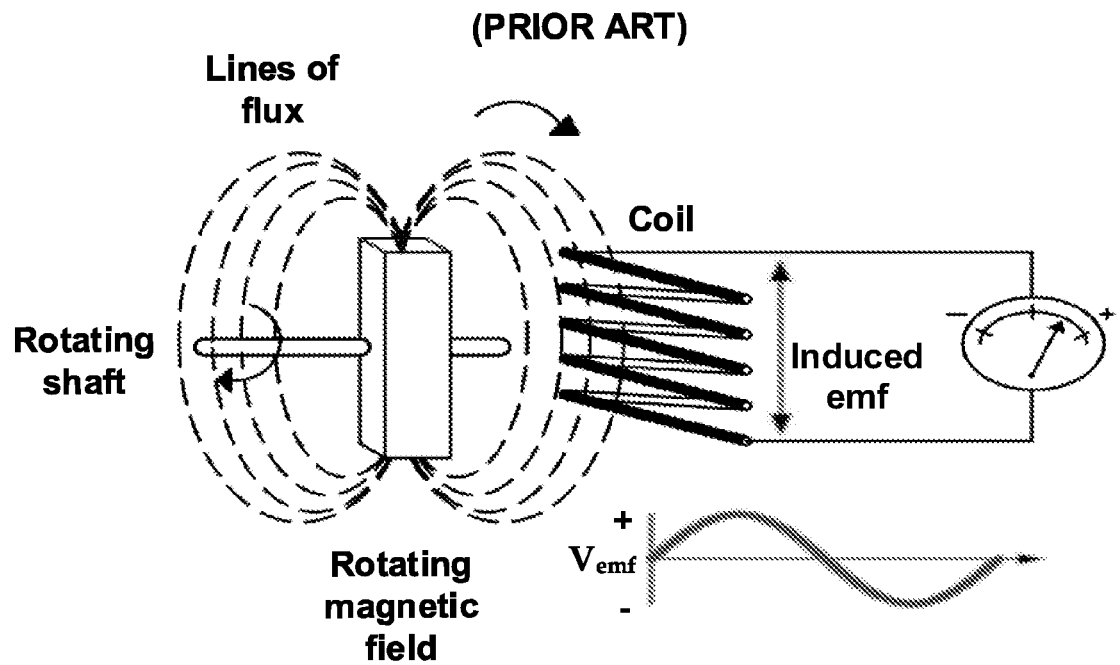
FIG. 1 shows an emf voltage induced at a stationary coil in proximity to a magnet that is rotated by a rotating shaft according to the prior art.

Throughout the following description, specific details are set forth in order to provide a more thorough understanding to persons skilled in the art. However, well known elements may not have been shown or described in detail to avoid unnecessarily obscuring the disclosure. The following description of examples of the technology is not intended to be exhaustive or to limit the system to the precise forms of any example embodiment. Accordingly, the description and drawings are to be regarded in an illustrative, rather than a restrictive, sense.

This invention presents a system for generating electrical energy using induction and a method of operating same. The efficiency of the energy produced by the system described in the current disclosure is higher than that of the maximum efficiency achieved in power plants known in the art. The system is achieved by considering Faraday's law of induction.

Faraday's law predicts how a magnetic field will interact with an electric circuit to produce an electromotive force (EMF). This phenomenon is known as electromagnetic induction and is used in transformers, inductors and many electrical motors, generators and solenoids. The law states that there is EMF on the conductive loop when the magnetic flux through the surface enclosed by the loop varies in time. The EMF is defined as the electromagnetic work done on a unit charge when it has traveled one round of a conductive loop. This relationship is shown mathematically in equation (1) below:

$$\varepsilon = -\frac{d\Phi_B}{dt} \tag{1}$$

where ($\varepsilon$) is the EMF and $\Phi_B$ is the magnetic flux, which is the surface integral of the normal component of the magnetic field B passing through a surface S and can be expressed as:

$$\Phi_B = B \cdot S \cos\theta \tag{2}$$

where $\theta$ is the angle between the magnetic field line and the normal to the surface S. For a tightly wound coil of wire, composed of N identical turns, each with the same $\Phi_B$, the EMF is represented as:

$$\varepsilon = -N\frac{d\Phi_B}{dt} \tag{3}$$

The Maxwell-Faraday equation describes the fact that a spatially-varying electric field always accompanies a time-varying magnetic field. Specifically, a change in magnetic flux produces an electric field over a closed loop. Mathematically, this is represented as:

$$\oint_{\partial\Sigma} E \cdot dl = -\frac{d}{dt}\int_{\Sigma} B \cdot dA. \tag{4}$$

Where $\Sigma$ is a surface bounded by the closed contour $\partial\Sigma$, E is the electric field, B is the magnetic field, dl is an infinitesimal vector element of the contour $\partial\Sigma$, dA is an infinitesimal vector element of surface $\Sigma$ and where $\Sigma$ is not changing over time.

Also, it is known that in a coil, the magnetic field may be generated by a current carrying conductor. The behaviour of the magnetic field in such case is similar to that of a bar magnet. The relationship between the magnetic field and the current is expressed as follows:

$$B = \mu n I \tag{5}$$

Where $\mu$ is the relative permeability of the core material, n=N/l is the number of turns per unit length of the solenoid and I is the current. So, the magnetic field is directly proportional to the current I in the coil.

Figure 2:
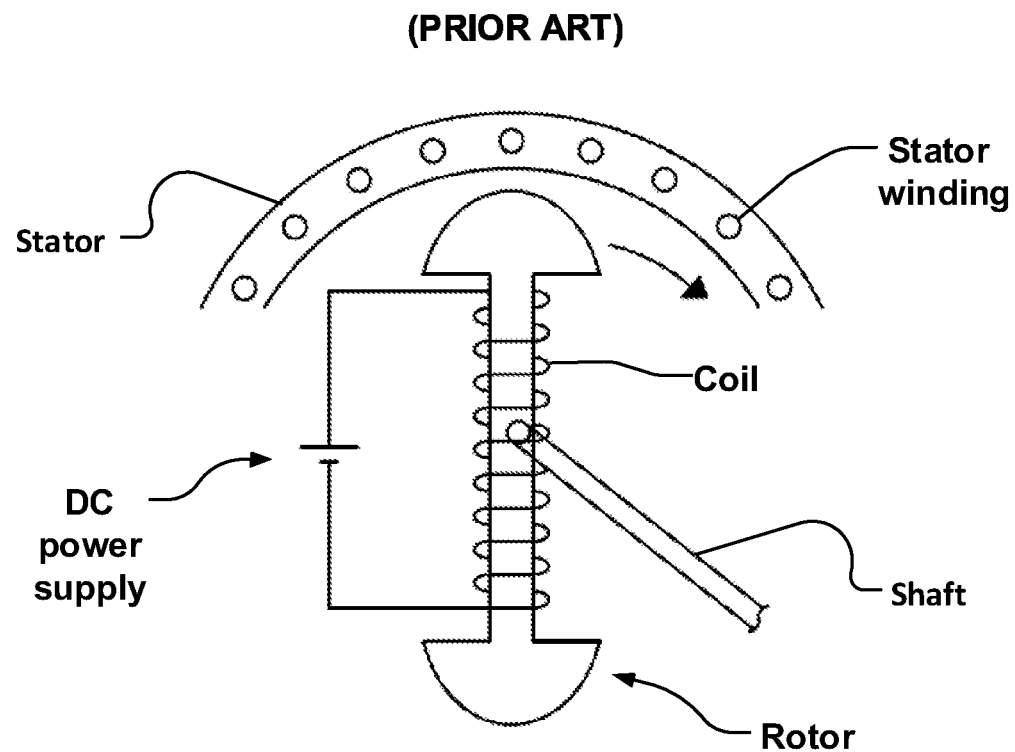
FIG. 2 shows a partial longitudinal cross-sectional view of an induction generator according to the prior art.

FIG. 2 shows a representation of current applications of Faraday's law of induction in power generation plants for producing an EMF in the stator by rotating an electromagnet position on a rotor along with its magnetic field in the generator. The electromagnet is supplied with a DC voltage to generate its magnetic field. As such, the magnetic field is considered to be unchanged. The rotation of the magnet and that of the magnetic field causes the magnetic flux to change from zero to maximum as the angle θ between the magnetic field lines and the normal to the surface of the stator changes. The rotation is established via a shaft that is coupled to the rotor. The shaft is usually powered by a steam turbine that is powered by other forms of energy like steam generated from boiling water or other known sources of energy that are converted to the mechanical movement of the shaft. This rotation induces an EMF in the stator and produces an electrical current in a loop.

So, the rotation of the shaft controls the rotation of the rotor and that of the magnetic field in the generator. As such, this is considered a limitation on the currently used electromagnetic generators and affects the efficiency of such systems since the system will suffer from energy loss due to friction, heat, etc. Specifically, the efficiency is calculated as (input−loss)×100%, where the loss is attributed to all energy used to induce the mechanical movement and where the input is the change of flux of the magnetic field over time.

Traditionally, the generation of the electrical current is explained by Faraday's law of induction, Maxwell-Faraday's equation as well as Lorentz force which is presented in equation (6):

$$F = Q \cdot v \times B \qquad (6)$$

where F is the force on a point charge Q and v is the velocity of the charge Q in a uniform magnetic field B. Equation (6), describes the motional EMF such that the force applied on a charge particle on a coil that is in a magnetic field causes a potential difference (EMF) and the charge moves due to this potential difference generating a current in the coil. The same equation applies if the coil is held stationary and the magnetic field is moved.

From the point of view of the point charge, when the coil moves in the uniform magnetic field, it experiences a change in magnetic field as the charge crosses the magnetic field lines. In the alternative view, the charge still experiences a change in magnetic field as the magnetic field lines cross the charge. So, it is contemplated that for the charge, the only relevant aspect is the rate of change of the magnetic field across it. The charge does not know if the coil is moving or if the magnetic field is moving. Rather, what is relevant is whether there is a rate of change of magnetic field lines across it. Said differently, from the perspective of the charge, what is relevant is whether there is a sudden change in the magnitude or intensity of the magnetic field ($d\Phi_B/dt$). For example, the charge will experience an EMF from the change over time of the number of magnetic field lines that intersect it.

In the current disclosure, a fundamental change is introduced to the way the induction generator is configured and operated. More specifically, instead of moving the rotor of the generator to have a rate of change in the magnetic flux on the stators, the magnetic flux is changed by varying the magnetic field B in time, which is established by changing the current supplied to the electromagnet in the rotor over time. As such, in the invention of the current disclosure, the need to rotate the rotor and the electromagnetic field or the need to rotate the coil between stationary magnets is eliminated. In fact, assuming the same rate of change in the magnetic flux is established, this allows for the same EMF to be induced in the stators without having to physically move the rotors or the electromagnet. From the point of view of the charge on the coil, by varying the rate of change of the current (and that of the magnetic field), the number of magnetic field lines intersecting a unit charge will vary in time. In accordance with Faraday's law of induction, this leads to the generation of an EMF at the stator.

Therefore, the need is eliminated for a shaft, turbine as well as all the components of the system used in the traditional power generation plants to power the turbine and the shaft. Without the need for the shaft, turbine and other components, the energy loss due to friction, heat, torque, etc. is eliminated. Without needing to subtract such energy loss from the overall output of the generator, this allows for increasing the efficiency of the induction generator.

Figure 3:
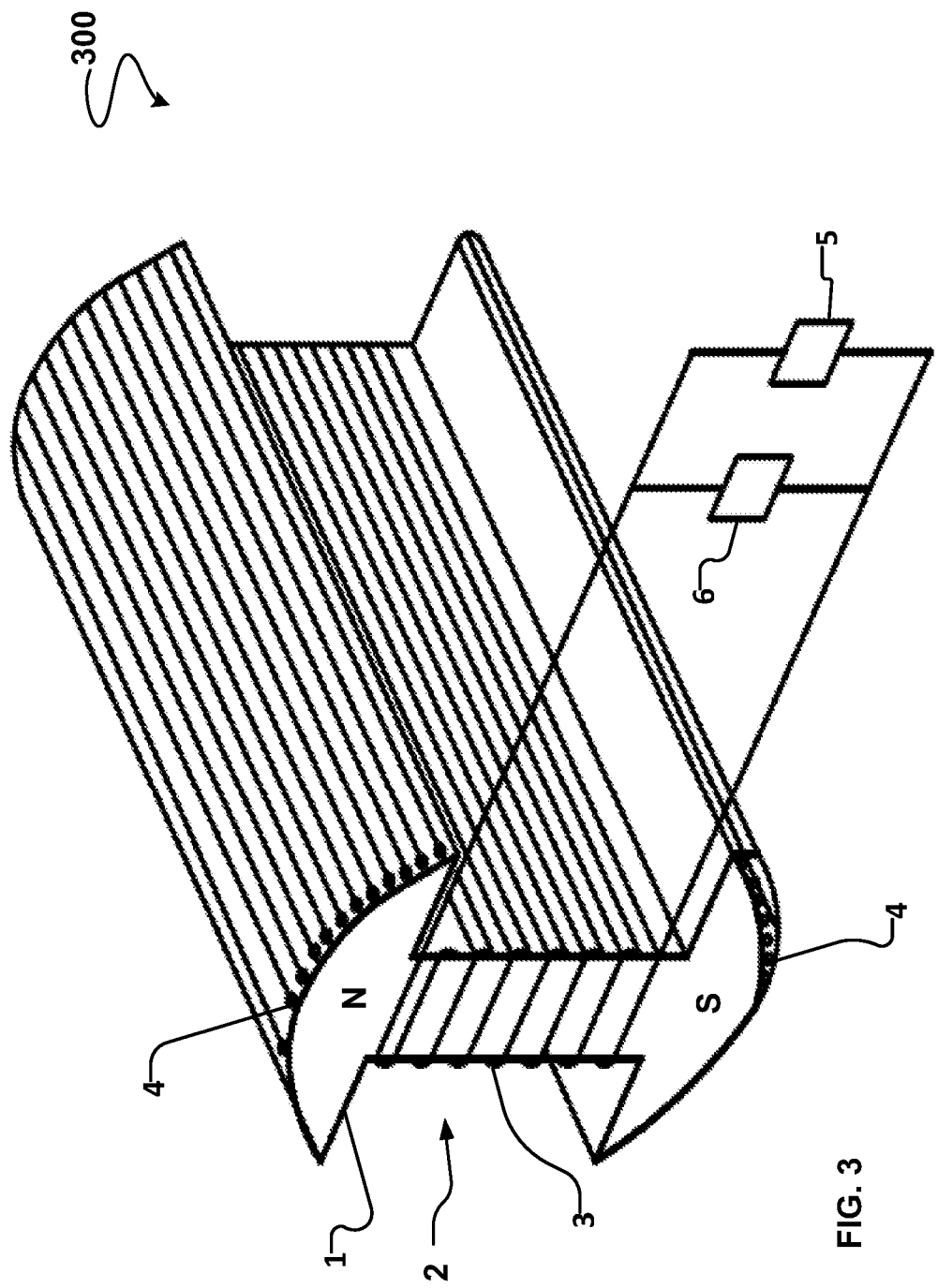
FIG. 3 shows a perspective view of an induction generator according to an embodiment of the current invention.
Figure 4:
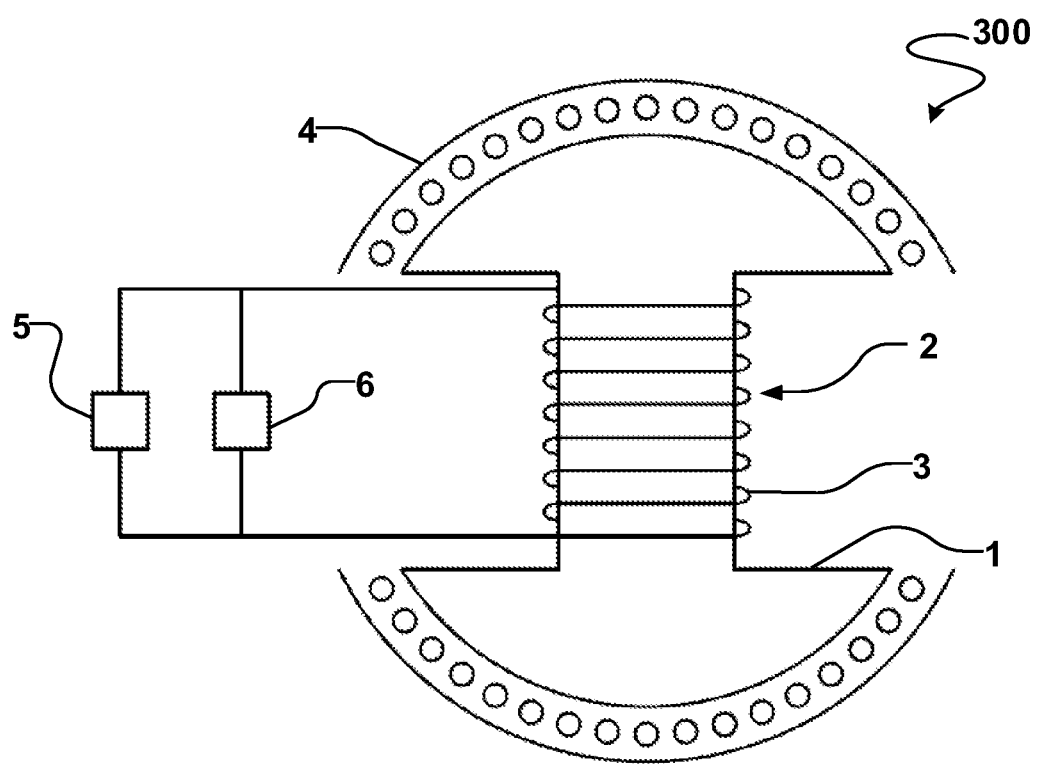
FIG. 4 shows a partial longitudinal cross-sectional view of the induction generator of the embodiment shown in FIG. 3.

FIG. 3 shows a partial perspective view of an induction generator 300 according to an exemplary embodiment of the current invention. In FIG. 3, a rotor 1 is shown to form an electromagnet 2 by winding a coil 3 around a section of rotor 1 and supplying a potential difference from a power supply 5 across the ends of coil 3. FIG. 3 shows the north pole N and south poles S of electromagnet 2. The core of the electromagnet may be made from any material known in the art for assembling an electromagnet. By way of non-limiting example, the core may be an iron core. FIG. 3 shows stators 4 to be positioned in close proximity of the north and south poles of electromagnet 2. As shown from FIG. 3, both the rotor 1 and the stators 4 are stationary. FIG. 4 shows a partial longitudinal cross-sectional view of generator 300.

The core in FIG. 3 is shown to have a unitary structure and to be made from one material. However, it is to be understood that in other embodiments of the invention, the core may take different forms and/or may be made from two or more different material. Any known materials in the art for the coil 3 and the stator 4 may be used in the current invention including but not limited to superconducting material to minimize the resistance of the coil and wires.

In the embodiment described in FIGS. 3 and 4, a frequency modulator 6 is provided. The modulator 6 allows for controlling and changing the frequency with which the current is supplied by power supply 5 to electromagnet 2. In some embodiments, the modulator 6 may be separate from the power supply and has its own power supply, such as the one shown in FIG. 3. In other embodiments, the modulator may be built into the power supply. Any power supply known in the art may be used for either configuration. In some embodiments, such power supply may be obtained from extra coils in the stator that are dedicated for this purpose. In such embodiments, the initial working of the system will require an external power source. After some time of operation of the system, the EMF induced at the dedicated extra coils will be cycled back into the system to supplement the external power source. This is similar to current existing power plant technology, where the DC voltage external power supply supplied to the electromagnet is supplemented by EMF generated from dedicated coils in the stator of the system after some cycles of operation. This is possible since the addition of dedicated coils in the stator will allow for harvesting some of the potential magnetic energy stored in the magnetic field that would not be harvested otherwise.

Since the modulator 6 is used to change and control the frequency with which the current from the power supply 5 is provided to electromagnet 2, the power supply may be either AC or DC. Also, different modulation signals known in the art may be used in the modulator 6 to modulate the current frequency of the power supply 5. By way of none limiting example, the modulator 6 may apply to the current of the power supply 5 any one of a combination of pulse waves, square waves, triangular waves, triangular pulses, sinusoidal waves, sawtooth waves or other forms of waves or pulses known in the art for frequency modulation.

As indicated in equation (5), the magnetic field is directly proportional to the current supplied to the electromagnet by the power supply. Also, from equation (3), EMF is shown to be proportional to the change of flux over time. Further, by keeping the rotor 1 and stators 4 stationary and by configuring the system to orient the stator windings such that the angle between the magnetic field and the normal to the surface of the stator winding to be zero, equation (2) is simplified as:

$$\Phi_B = B \cdot S \tag{7}$$

With the surface area being known and by configuring the system so that the surface area of all stator winding is the same, equation (7) shows that the flux is directly proportional to the magnetic field. Therefore, by combining equation (7) with equations (5) and (3), it is shown that the EMF generated at the stator is directly proportional to the rate of change of the current supplied by the power supply to the electromagnet at the rotor.

Figure 4A:
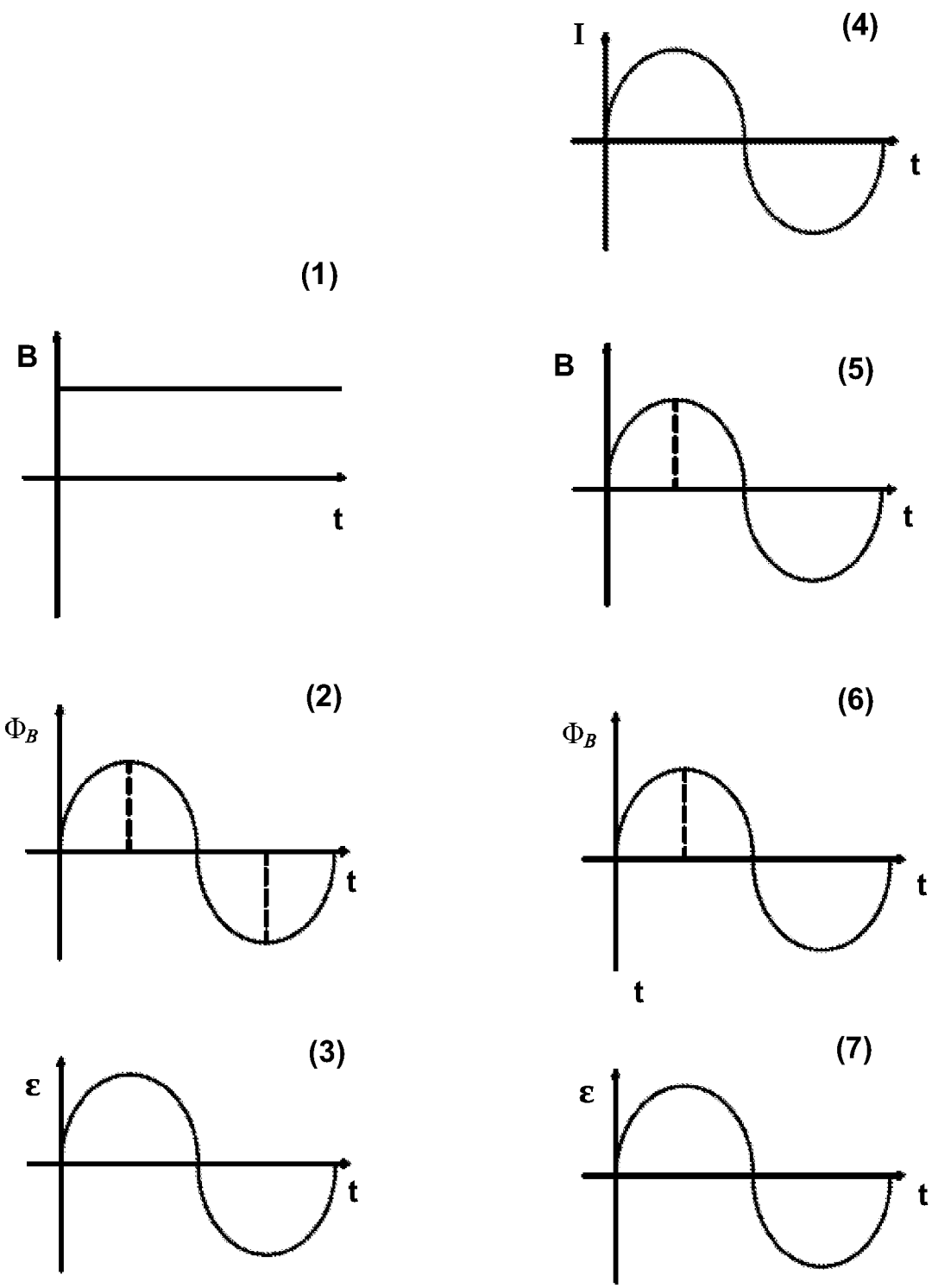
FIG. 4A shows a comparison between the general behaviour of the magnetic field at the rotor, as well as the magnetic flux and the EMF generated at the stator in the traditional induction generator and the invented induction generators described in this disclosure. All functions are normalized and phase shift is applied, where required, for the purpose of comparison.

FIG. 4A shows a comparison between the behaviour of the magnetic field at the rotor, as well as the magnetic flux and the EMF generated at the stator in the traditional induction generator and the invented induction generators described in this disclosure. All functions are normalized and phase shift is applied, where required, for the purpose of comparison. In FIG. 4A-(1), the magnetic field in the traditional induction generator is maintained at a constant level by providing the electromagnet with a DC voltage. Using equation (2), to plot the magnetic flux for that system, it is observed that the flux is directly proportional to the $S \cdot \cos \theta$. FIG. 4A-(2) shows a depiction of the flux as $\theta$ goes from 0 to $2\pi$ over time. Finally, a depiction of the EMF generated in that system is plotted in FIG. 4A-(3) in view of equation (1). For the new induction generator, an AC or DC excitation voltage with a modulated current frequency is provided to the electromagnet over time. By way of non-limiting example, the nature of the modulation may be chosen such that the current is shown in FIG. 4A-(4) to behave as a sinusoidal signal over time. Given the direct proportionality between the current and magnetic field, the magnetic field in FIG. 4A-(5) is shown to have the same behaviour as the current over time. The same is seen in FIG. 4A-(6), where $\theta$ varies from 0 to $2\pi$ and where the surface area of the stator windings is maintained constant. Finally, FIG. 4A-(7) shows a depiction of the EMF generated in the new induction system over time in view of equation (3). It is worth noting that the behaviour of the EMF generated in the new system and the traditional system is substantially similar.

Figure 5:
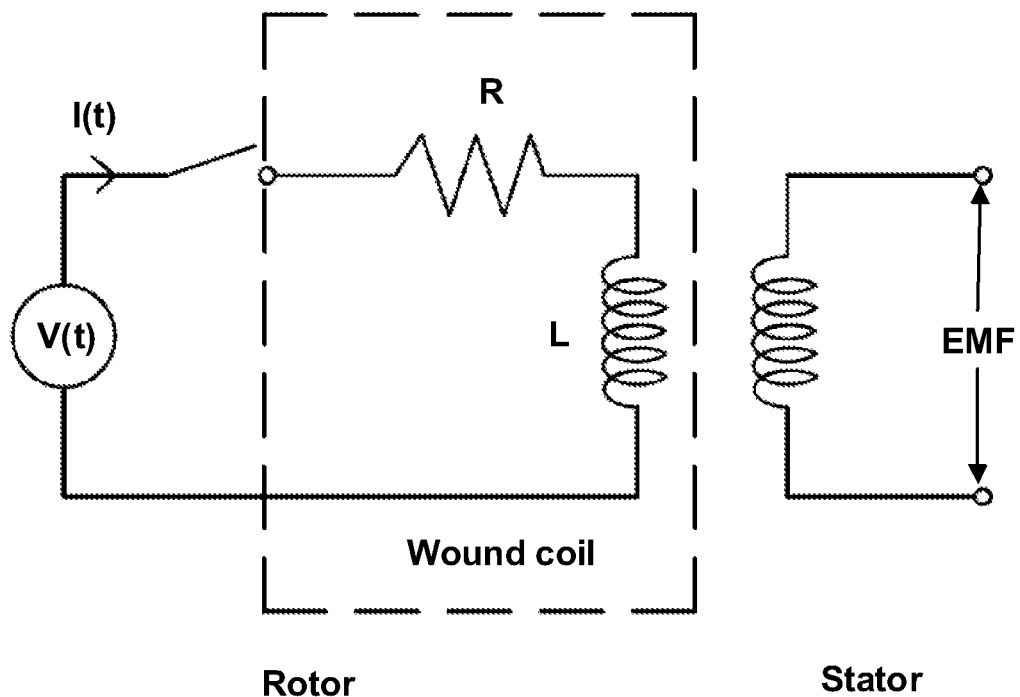
FIG. 5 shows a schematic diagram of an LR series circuit representing the rotor and stator of the induction generator according to an embodiment of the current invention

FIG. 5 shows an LR series circuit representing the rotor, where the resistance R is that of the coil and the inductor L is representative of the coil wounded around the electromagnet subjected to a voltage and current varying over time when the circuit is closed (i.e. the switch is on). FIG. 5 also shows the inductor representing the stator windings on the stator side of the induction generator 300 in FIG. 3. It is to be understood that in other embodiments, more generative equivalent circuits of a synchronous generator may be used. Also, in some embodiments, the efficiency of the generator may be improved by adding a capacitor at the output of the V-phase to reduce the amount of excitation voltage required. Also, in some embodiments, the efficiency of the generator may be improved by adding a capacitor at the output of the stator coils to improve the output EMF.

Referring to the circuit shown in FIG. 5, in a closed circuit, and when the voltage source is DC, the current I(t) begins to flow through the circuit but does not immediately reach its maximum value of V/R as determined by Ohms Law. The behaviour of the current over time in this circuit is shown in FIG. 6 and follows the mathematical expression:

$$I(t) = \frac{V}{R}(1 - e^{-Rt/L}) \tag{8}$$

where L/R represent the time constant ($\tau$) and where V/R represents the final steady state current value after five times constant values. Once the current reaches this maximum steady state, the inductance of the coil is reduced to zero acting more like a short circuit and effectively removing the inductor from the circuit.

Figure 6:
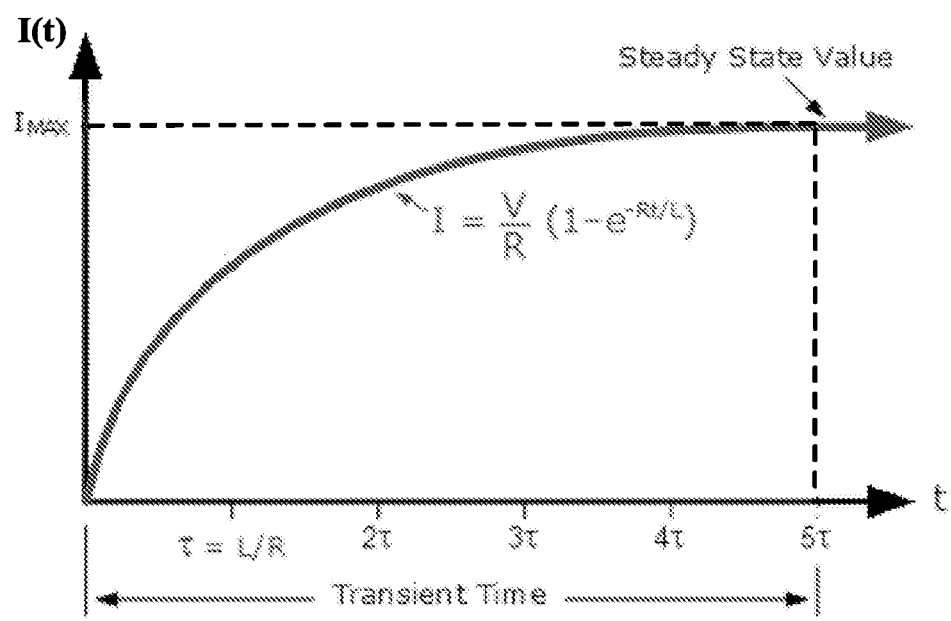
FIG. 6 shows the behaviour of the current I(t) over time in the LR circuit shown in FIG. 5 when V(t) is a Direct Current voltage supply.

The rate of change of current I(t) over time (dI(t)/dt) is the slope of the curve shown in FIG. 6. Therefore, combining equations (8), (7), (5) and (3), the EMF at the stator side may be expressed as follows:

$$\varepsilon = -L\frac{dI(t)}{dt} \tag{9}$$

Where $$L = \frac{\mu N_S N_R S}{l_R},$$

and where $N_S$ represents the number of turns of the coil at the stator side, $N_R$ represents the number of turns of the coil at the rotor side, S is the surface area of the stator winding and $l_R$ represents the length of the coil in meters.

According to equation (9), an EMF is generated at the stator by varying the rate of change of the current supplied to the electromagnet at the rotor over time. Also, from FIG. 6, it is seen that the higher the frequency of the current I (i.e. the shorter the time period of the step after t=0 of transient time), the higher the EMF produced. However, it should be noted that a practical condition on the system must be applied in that the infinitesimal step in the time domain must be greater than zero.

Referring back to the circuit shown in FIG. 5, in a closed circuit, and this time, when the voltage source is AC, the behaviour of the current over time may be expressed by solving the following ordinary differential equation:

$$A\sin(2\pi ft) = I(t)R + L\frac{dI(t)}{dt} \tag{8a}$$

where the left side represents the voltage in time, having A as the signal amplitude and f as the frequency, and where the first term of the right side represents voltage across resistor R in view of current I(t) on the rotor side and the second term represents the voltage across inductance L in view of current I(t) on the rotor side. Using ordinary differential equations principles, I(t) may be presented as follows:

$$I(t) = \frac{A\left[\left(\frac{R}{L}\right)\sin(2\pi ft) - 2\pi f\cos(2\pi ft)\right]}{L\left[4\pi^2 f^2 + \left(\frac{R}{L}\right)^2\right]} + \frac{2\pi A f L e^{\left(\frac{-R}{L}\right)t}}{4\pi^2 f^2 L^2 + R^2} \tag{8b}$$

Combining equations (8b), (7), (5) and (3), the EMF at the stator side may be expressed according to equation (9) above. According to equation (9), an EMF is generated at the stator by varying the rate of change of the current supplied to the electromagnet at the rotor over time.

Returning to the setup described of the induction generator 300 in FIG. 3, it is noted that the modulator 6 may be configured to increase the frequency of the current of the power supply that is provided to the electromagnet 2. Different frequency modulators known in the art may be used in this embodiment. The limitation of how high the frequency may be increased in the system will be limited to the physical capability of the modulator chosen by the user.

In the traditional induction generator, the rotating shaft is responsible for controlling and changing the speed of the rotation of the electromagnet and that of the magnetic field. According to industry standards, the rotor is usually rotated at 3,000 RPM/50 Hz or at 3,600 RPM/60 Hz to produce the desired electrical voltage output. Although the shaft is capable of establishing rotation at a higher RMP, this is not done in practice as the amount of torque used to achieve such rotational speed will be too taxing on the system and will reduce the overall efficiency of the induction generator system. Also, operating at such speed may cause excessive heat that may jeopardise the integrity of the mechanical mechanism operating the shaft. For this reason, the traditional induction generator is usually operated at 3,000 RPM/50 Hz or 3,600 RPM/60 Hz to strike an equilibrium between the energy consumed to allow the shaft to rotate at such speed and the total energy output produced by the system.

In comparison, the induction generator presented in this current disclosure does not have the same limitation. As noted above, the rotor is held stationary. Also, as provided in equation (9), the EMF generated is proportional to the rate of change of the current. The energy requirement to power a modulator is significantly less than the energy requirement for mechanically rotating a shaft in the traditional induction generator. Further, known frequency modulators in the art allow for controlling frequency in the range of 45 KHz. This is approximately 900 times the maximum RPM speed the traditional rotor may be rotated using the shaft mechanism. Given that the energy requirement to control the frequency at this rate is not taxing to the system and given the lack of mechanical constraints of rotating the rotor as those present in the traditional system, this allows for significantly increasing the efficiency of the new induction generator in comparison to the traditional one.

By increasing the frequency of the current using the modulator, the rate of change of the current is increased and so is the rate of change of the magnetic field. Such increase in rate of change in the current and magnetic field may lead to reducing the magnitude of the magnetic field. This is reasonable to understand since the time period for the current to build up in the inductor will be reduced as the frequency is increased. In order to achieve a high efficiency in the induction generator of the new system, it may be desired to establish an equilibrium between the modulator frequency used and the optimal electrical voltage output achieved.

Some of the general properties of the magnetic field lines are that the lines never cross one another and that their density decreases with increasing distance from the poles. In FIG. 3, the embodiment in the figure shows the stator section covering in close proximity only the poles of the electromagnet in the rotor. This is done because the rotor in this generator is stationary and also because the design of the system is such that the stators are position in alignment with the poles only to achieve θ=0 between the magnetic field lines and the normal to surface area of the stator winding. So, the remaining sections of the sphere surrounding the rotor in the embodiment in FIG. 3 are shown to not be covered by stators. In such embodiment, this is done to minimize material usage in the manufacturing of the induction generator.

Figure 7:
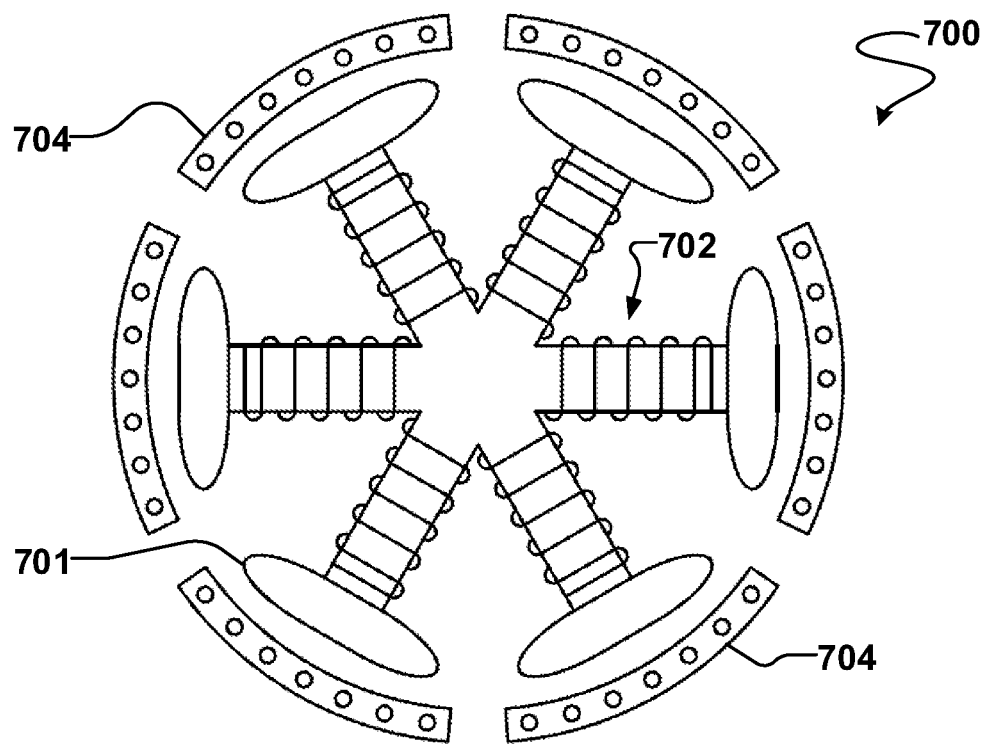
FIG. 7 shows a partial cross-sectional view of an induction generator according to an embodiment of the invention, where the multiple electromagnets and corresponding stator sections are provided.

By not positioning stators in sections of the magnetic field, some of the magnetic potential energy is not harvested. To remedy this, different embodiments will be described below. One embodiment may comprise more than one electromagnet in the rotor section of the generator. A non-limiting example of such design is shown in FIG. 7. The rotor 701 of the generator 700 is shown to have six poles that are stationary. Stator sections 704 are configured to cover in close proximity each of the six poles to the three electromagnets 702. To avoid magnetic interference from the different electromagnets in the rotor, material with low permeability may be used in the gap areas between adjacent poles in the system. Any known material in the art with such capability may be used. It is to be understood that the number of electromagnets in other embodiments may be more or less than three. Also, the core material of the electromagnet may be all made from the same material or from different material. Further, the strength an intensity of the magnetic fields may be the same for each of the three electromagnets or it may be different. A single power supply may be used to provide the excitation voltage to all electromagnets in the system or separate power supplies may be used. In one embodiment of the invention, the rotor will circulate a 3-phase sinusoidal current with 120 degrees phase between each consecutive current signal. The currents that change value over time will induce an EMF in the stator sections, which is equivalent to the rate of change in the magnetic flux.

Figure 8:
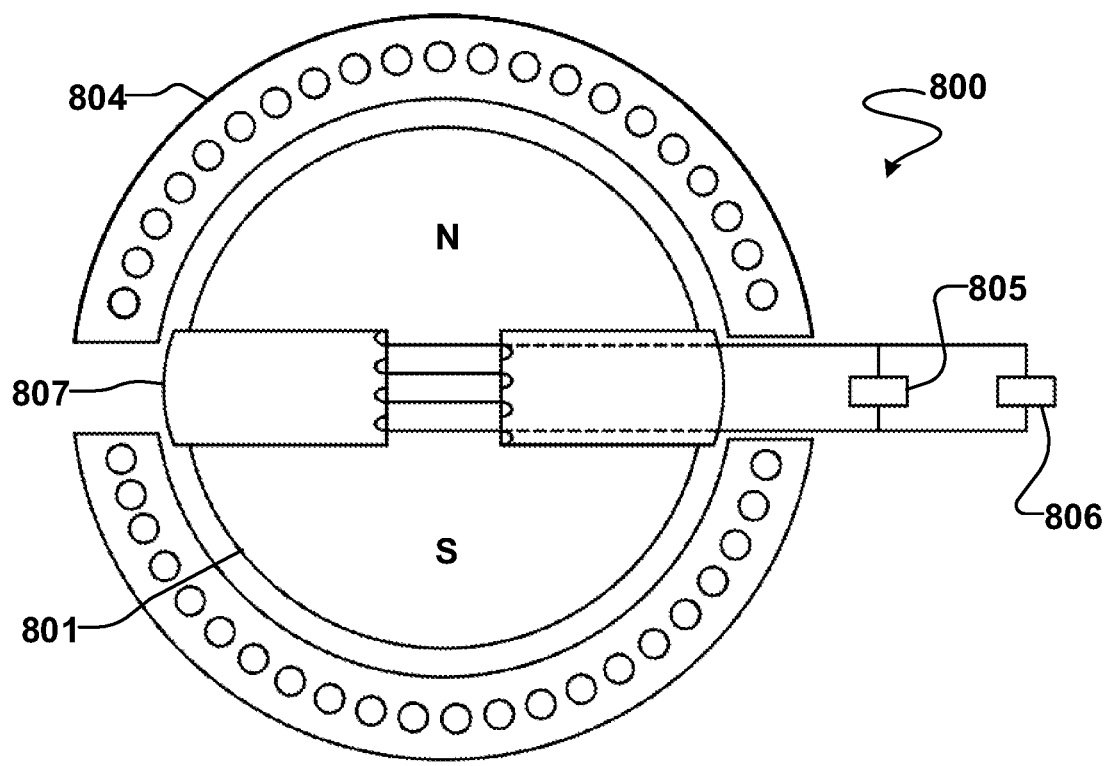
FIG. 8 shows a cross-sectional view of an exemplary induction generator according to another embodiment of the invention.

In an alternative embodiment, a different design of the generator rotor is contemplated to cover as much as possible of the area of induced EMF in the stator. This may be achieved, for example, by increasing the surface area of the north and south pole such that the two poles form almost two complimentary lobes of a spherical shape with a space therebetween. A stator having a spherical shape may be then used to cover the substantially spherical rotor. This design maximizes the surface area of the stator covering the rotor. This allows for substantially all the magnetic field to be utilized by exposing it to winding of the stator covering the rotor. In such embodiment, the magnetic poles are contemplated to be very close to and opposite to one another as seen in FIG. 8. It is known that magnetic field lines seek the path of least resistance in moving from the north pole to the south pole external to the magnet. To prevent the magnetic lines from moving from the north pole to the south pole in the small void separating the two spherical shaped lobes 801 of the electromagnet and to force the magnetic field lines to take a path external to the spherical shape such that they may intersect the stator 804 and induce EMF in the stator 804, a thin layer 807 built using Voltage Control magnetism (VCM) may be placed between the north and south poles as shown in FIG. 8. Alternatively, material with poor magnetic conductivity may be used in place of the VCM material. Any material known in the art of such characteristics may be used for this purpose. As provided in earlier embodiments, power supply 805 and modulator 806 are provided to power the electromagnet and control and change the frequency at which the current is provided by the power supply.

Figure 8A:
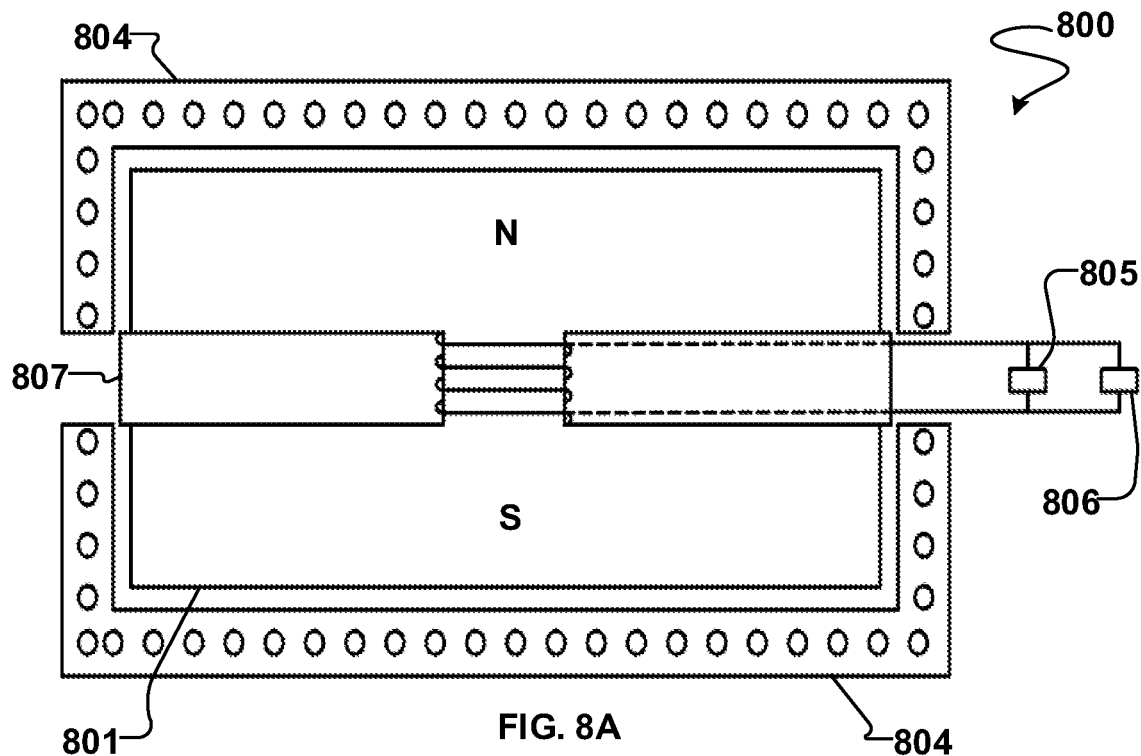
FIG. 8A shows a cross-sectional view of an exemplary induction generator according to yet another embodiment of the invention.

In the exemplary embodiment presented in FIG. 8, the shape of the magnetic poles and the surrounding stator was configured to be spherical. However, it is to be understood that other shapes are contemplated in this invention. By way of non-limiting example, the north and south poles may form two complementary parts of a box shape with a space therebetween as seen in FIG. 8A. The stator would be formed in a complementary shape and positioned external to and in close proximity of the corresponding sections of the north and south poles so that to maintain θ=0 between the magnetic field lines of the electromagnet and the normal to surface area of the stator windings.

Figure 9:
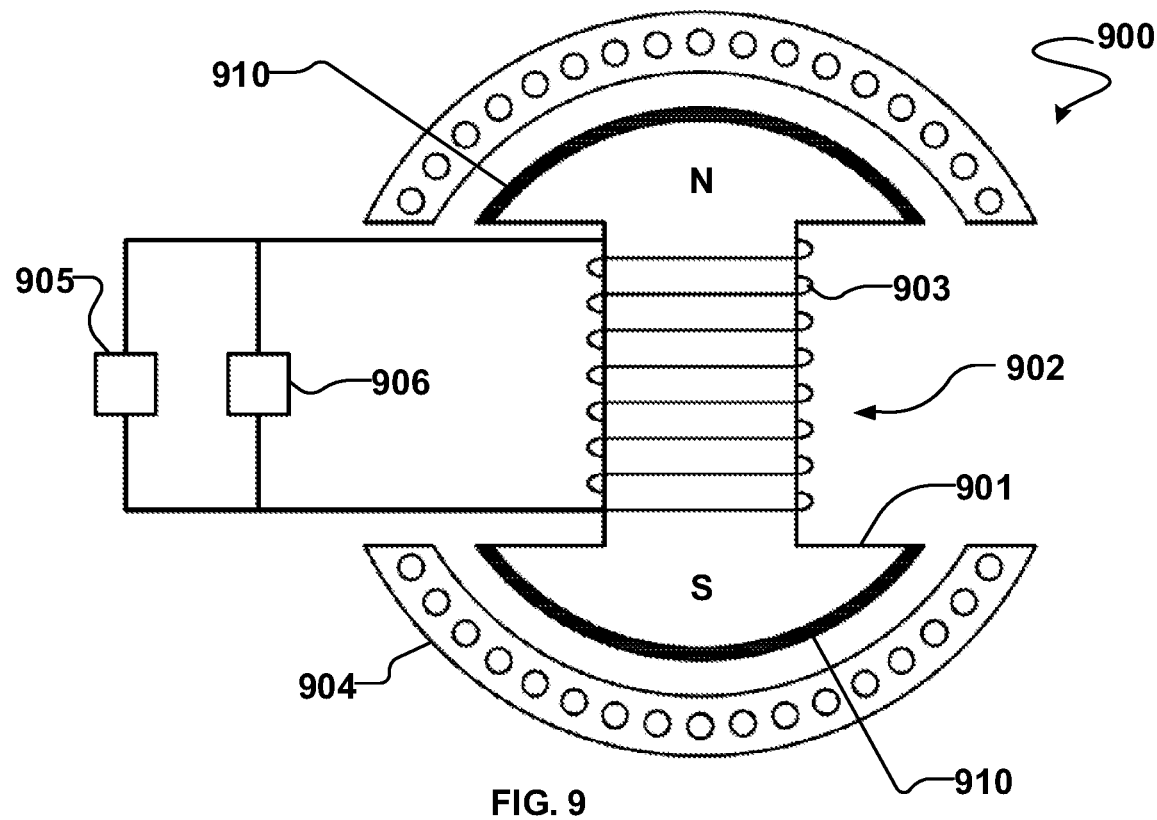
FIG. 9 shows a cross-sectional view of an induction generator according to an embodiment of the invention utilizing material built using Voltage Control Magnetism (VCM).

FIG. 9 shows another alternative embodiment, in which a generator 900 is shown to have the same setup as presented in FIG. 3 and FIG. 4. However, in this embodiment, a thin layer 910 built using voltage control magnetism (VCM) is positioned between the rotor 901 and the stator 904 for each of the north and south poles. The placement of such layer may serve to block the magnetic field lines from reaching the stator 904. A pulse width modulator (PWM) (not shown) may be used to control the frequency of when the thin layer 910 switches polarity and therefore acts as magnetic field lines blocker and when it allows the magnetic field lines to pass. Hence, the PWM allows for the simulation of an on-off-on high speed magnetic field across the winding of the stator 904. In such embodiment, the rotor 901 may be set at high enough current to allow a high magnetic field that could be set on-off rapidly allowing the EMF to be induced with high rapid changes of the magnetic flux (or magnetic field). This in effect allows for inducing a high EMF that may match or surpass the traditional generators with the mechanical shaft mechanism. It should be noted that if a PWM is used to modulate the on-off-on switching effect of the thin VCM layer 910, then modulator 906 may not be required to provide the excitation voltage for coils 903 of electromagnet 902. Also, in such embodiment, a DC voltage 905 may be used to provide the excitation voltage to the electromagnet.

Figure 10:
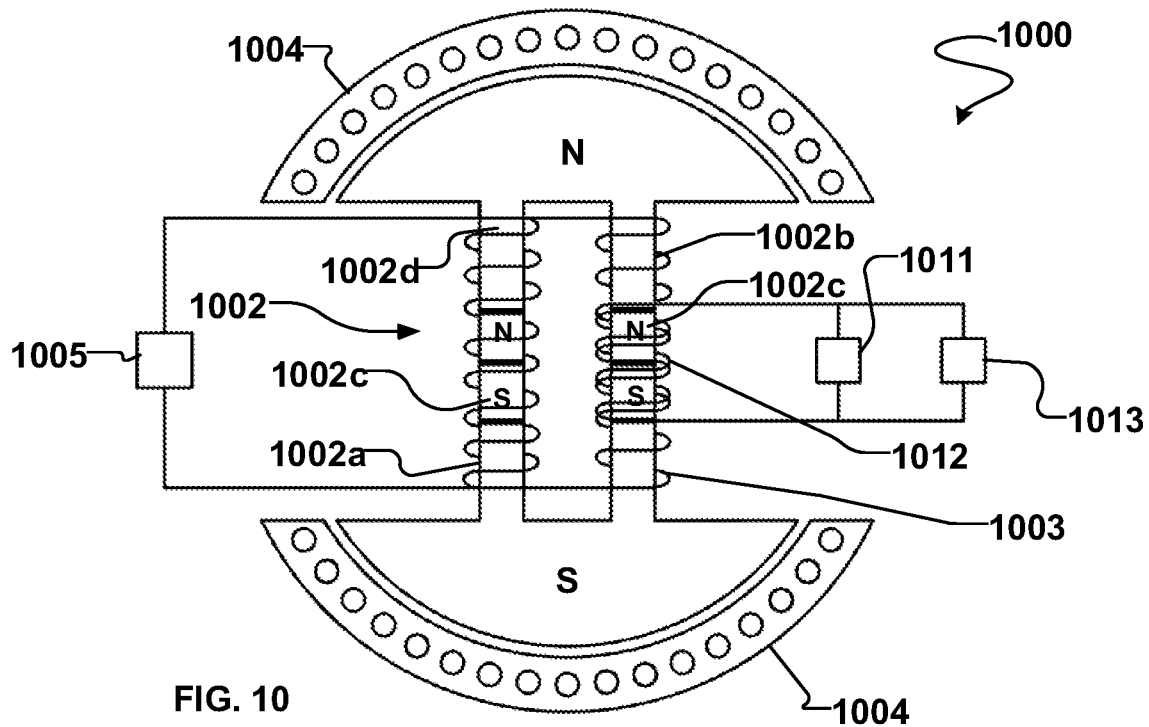
FIG. 10 shows a cross-sectional view of an induction generator, in which Electro Permanent Magnets (EMPs) are utilized according to an embodiment of the current invention.

FIG. 10 shows another exemplary embodiment of the current invention, where ElectroPermanent Magnets (EPMs) are utilized. In the induction generator 1000 presented in FIG. 10, the electromagnet 1002 is made of two sections 1002a and 1002b. Each of electromagnet sections 1002a and 1002b consists of two sections, where one section 1002c is made from "hard" (high coercivity) magnetic material and the other section 1002d is made from "soft" (low coercivity) magnetic material. In FIG. 10, the shaded parts represent the sections made from hard magnetic material. It is to be understood that any known material with such characteristics may be used for this embodiment. Coil 1003 is shown to be wound around each of the electromagnet section 1002a and 1002b and a power supply 1005 is used to power the electromagnet. An additional coil 1012, independent from coil 1003 is shown to be wound around the hard magnetic material section for only one of the two electromagnet section (around the hard section 1002c of section 1002b of the electromagnet in the example shown in FIG. 10) and is powered by a separate power supply 1011. The additional power supply 1011 and coil 1012 are used to change the behaviour of the magnetic field lines of the electromagnet. Specifically, when no power is provided to the coil 1012, the electromagnet will act as that described previously in FIG. 3, where the magnetic field lines will flow from the north pole to the south pole external to the electromagnet and in a closed loop formation in non-intersecting lines. This may be referenced as the ON configuration. A representation of the behaviour of the magnetic field lines in this configuration is shown in dotted lines in FIG. 11A.

However, with sufficient power applied to coil 1011 in FIG. 10, and due to the different coercivity of the hard magnetic material, the polarity of the poles in that section alone will reverse. One of the general characteristics of magnetic field lines is that the they flow from the south pole to the north pole in a magnetic material. With the change of the south and north poles in one section of the electromagnet and given that the magnetic field lines always seek the path of least resistance, this results in the flow of magnetic field lines internally in the electromagnet and the disappearance of the magnetic field lines external to the electromagnet. This may be referenced as the OFF configuration. A schematic representation of this phenomenon is shown in FIG. 11B. Therefore, when the magnetically soft and hard materials have opposing magnetizations, the electromagnet produces no net external field across its poles, while when their direction of magnetization is aligned the electromagnet produces an external magnetic field.

A modulator 1013 is used in the embodiment shown in FIG. 10 for controlling the frequency and duration of the current supplied by power supply 1011 to coil 1012. Modulator 1013 may be separate from or integral to power supply 1005. As a result of controlling the frequency and duration of the current supplied to coil 1012, the reversal of the magnetic poles for section 1002c of section 1002b of the electromagnet may be controlled by modulator 1013 at a fast rate depending on the limitation of the modulator 1013 used, which will result in an ON-OFF configuration of the external magnetic field. This in effect allows for the interruption of the magnetic field lines external to the electromagnet. From the point of view of a point charge on the stator winding 1004, the rate of appearance and disappearance of magnetic field lines intersecting the charge will simulate a change in the magnetic field and flux across such charge over time. As such, and in view of equations (3) and (7), an EMF will be induced in the stator coil 1004 as a result of this rate of change in magnetic field as well as magnetic flux.

Figure 12:
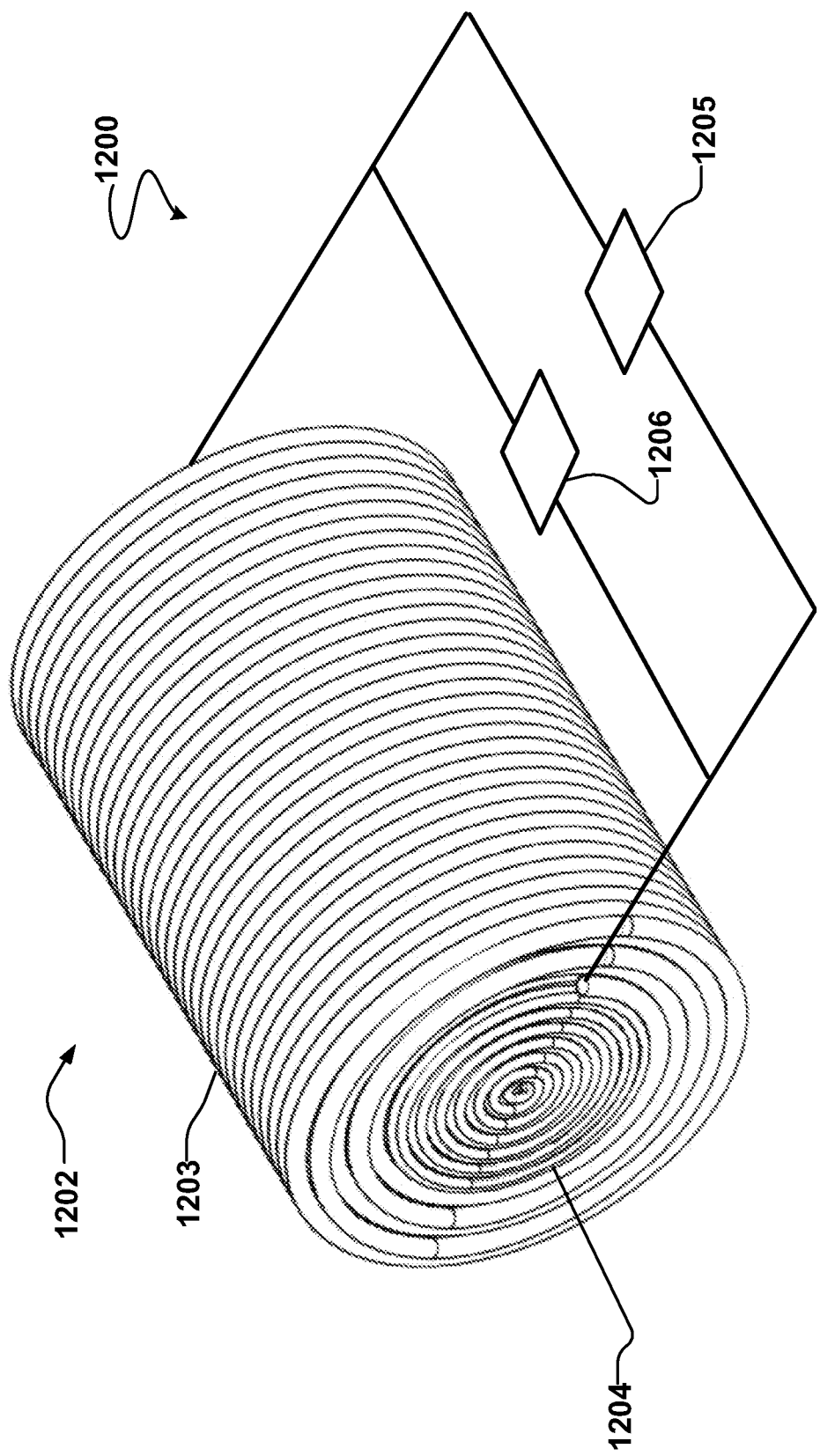
FIG. 12 shows a perspective view of an induction generator according to another embodiment of the current invention.

As previously discussed, the core of the electromagnet may be comprised from any material known in the art for forming electromagnets. In some embodiments, the electromagnet may be generated from a coil without a core. That is, the electromagnet in such embodiment is generated from a hollow solenoid. FIG. 12 shows an exemplary embodiment of an induction generator 1200 representing such structure. In FIG. 12, an electromagnet 1202 is formed by having a solenoid coil 1203 and supplying the coil with a potential difference from a power supply 1205 across the ends of coil 1203. It is known in the art that when a current passes through a solenoid, it creates a constant, uniform magnetic field inside the solenoid with the magnetic field lines parallel to the longitudinal axis of the solenoid.

The magnetics field within the solenoid depends on the current and density of the turns of coil. To take advantage of this property, in FIG. 12, the stators 1204 are placed inside coil 1203. This allows the stator coils to be in the path of the magnetic field lines generated by the electromagnet internal to the solenoid. FIG. 12A shows a partial perspective view of the generator in FIG. 12 with the stator coils 1204 partially inserted into the coil 1203. By orienting the stator coils such that the normal to surface area of the coil surface is parallel to the magnetic field line, this allows for maximizing the surface area of exposure to the magnetic field lines at all times. It is to be understood that various techniques known in the art may be used for stacking the stator coils in relation to the solenoid to minimize the skin and proximity effect and to maximize the EMF output.

Figure 12B:
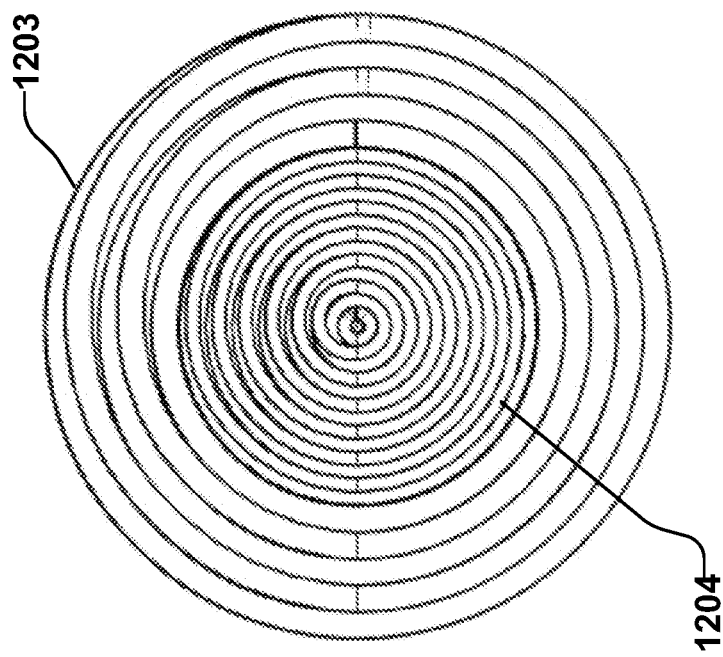
FIG. 12B shows a side view of the electromagnet coil and the stator of the induction generator in FIG. 12.
Figure 12A:
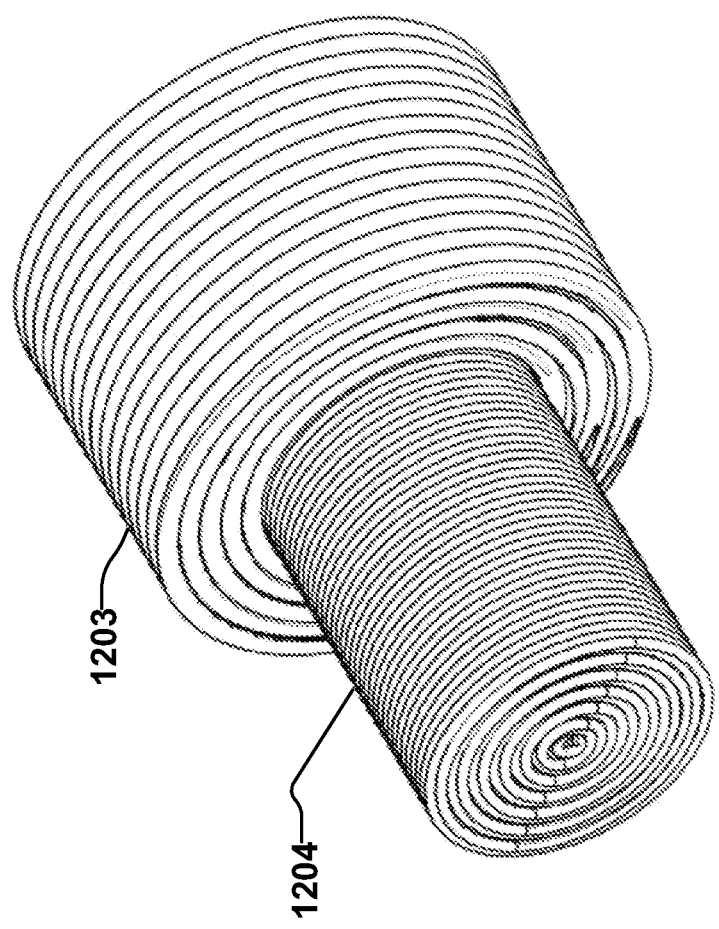
FIG. 12A shows a partial perspective view of the electromagnet coil of the induction generator of FIG. 12 with the stator coil partially inserted therein.

FIG. 12B shows a side view of the coil 1203 and the stator coil 1204 of FIG. 12. As shown in FIGS. 12, 12A and 12B, the stator windings are different than the windings of electromagnet coil 1203. In this exemplary embodiment, the stator coil is shown to have more turns per unit length in comparison to that of the electromagnet coil. In other embodiments (not shown) the electromagnet coil may have the same number of turns per unit length or less than that of the stator coils.

In the embodiment shown in FIG. 12, a modulator 1206 is used to change and control the frequency with which the current from the power supply 1205 is provided to electromagnet 1202. Similar to other embodiments disclosed, the power supply may be either DC or AC. Also different modulation signals known in the art may be used.

The magnetic field inside or outside the solenoid may be obtained using the principle of superposition and also with reference to Biot-Savart law. According to the above, equation (10) is established:

$$B_{tot} = \frac{\mu_0 I \, n}{2}\left[\frac{D+L}{\sqrt{(D+L)^2 + R^2}} - \frac{D}{\sqrt{D^2 + R^2}}\right] \quad (10)$$

where $B_{tot}$ is the total magnetic field calculated at a point that is D distance away from an edge of the solenoid coil, which has a length L and radius R and where $\mu_0$ is the permeability of free space, I is the current passed through the solenoid coil and n is the number of turns per meter of the solenoid.

Equation (10) describes the case where the current on the rotor is steady. In cases, where the current is changing in time, the total magnetic field may be found according to equation (11):

$$B_{tot} = \frac{\mu_T \, n}{2}\left[\frac{D+L}{\sqrt{(D+L)^2 + R^2}} - \frac{D}{\sqrt{D^2 + R^2}}\right] I_R(t) \quad (11)$$

Where $\mu_T$ is based on the permeability of the material inside the solenoid, which in this case includes air and the stator coil and where $I_R(t)$ is the current in time on the rotor side.

Combining equations (3), (5) and (11) allows us to express the EMF or induced voltage on a set of cables at the stator side with N turns and area $A_s$ of a single coil positioned at a distance D from a last coil in the rotor (i.e. solenoid), which has a radius R and is excited by a current $I_R(t)$. such expression is provided as follows:

$$\varepsilon = (-N_S A_S)\frac{\mu_T \, n}{2}\left[\frac{D+L}{\sqrt{(D+L)^2 + R^2}} - \frac{D}{\sqrt{D^2 + R^2}}\right]\frac{dI_R(t)}{dt} \quad (12)$$

where it is to be understood that EMF will be induced as long as the magnetic flux in changing with time. In other words, the EMF will be induced as long as the magnetic field B is changing with time and as long as $I_R(t)$ is such that to avoid saturation what may lead to a slow down or a stop of the change of B over time.

Figure 13:
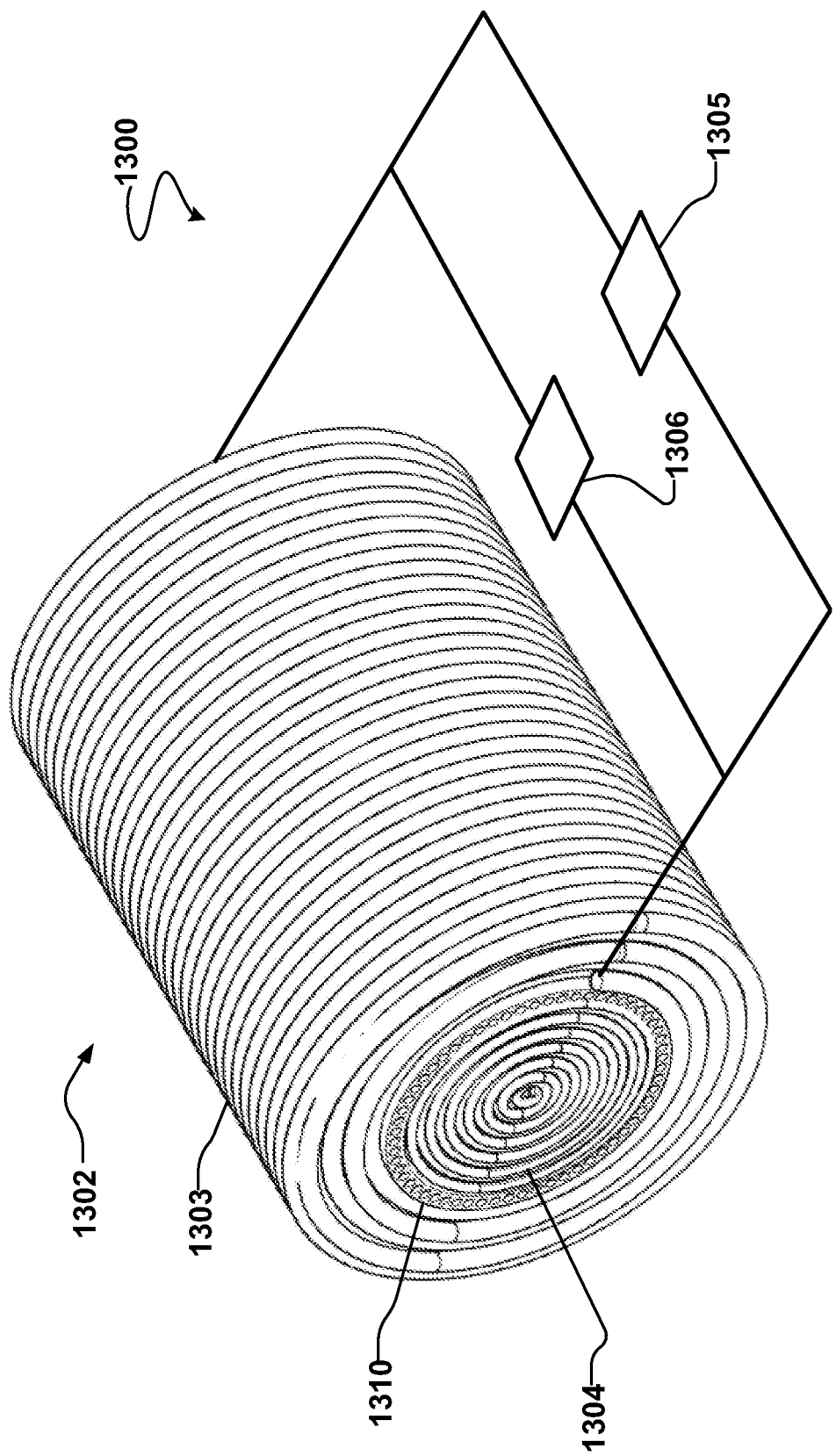
FIG. 13 shows a perspective view of an induction generator according to another embodiment of the current invention.

FIG. 13 shows a variant embodiment to the generator in FIG. 12. In FIG. 13, the generator 1300 comprises an electromagnet 1302 that 120 has a thin VCM layer 1310 between the solenoid coils 1303 and the stator coils 1304 positioned inside the solenoid. The thin layer 1310 in this configuration may be powered by its own power source (not shown). When enough power is supplied, the magnetic polarity in the VCM layer is reversed. This causes the VCM layer to block the magnetic field lines from passing throw the stator coils. In such embodiments, a modulator (not shown) is used to modulate the duration of the current supplied by the VCM power supply so as to control the duration of reverse polarity. This in effect creates an on-off-on mechanism of the magnetic field passing through the stator coils 1304 inside the electromagnet, which in turn induces EMF and current in the stator coils.

Figure 13B:
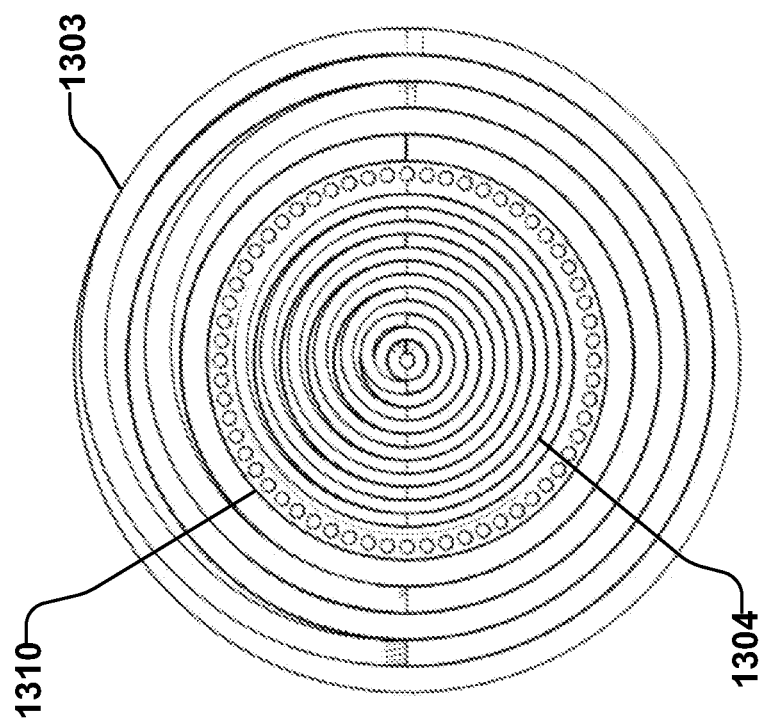
FIG. 13B shows a side view of the electromagnet coil, the stator coil and the VCM layer of the induction generator in FIG. 13.
Figure 13A:
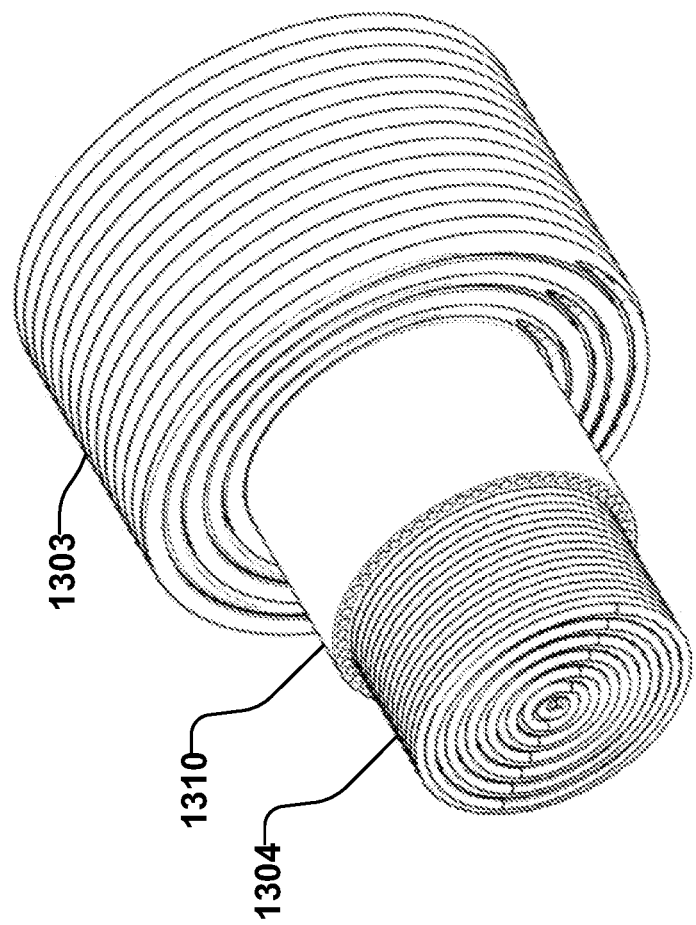
FIG. 13A shows a partial perspective view of the electromagnet coil of the induction generator of FIG. 13 with the stator coil and the VCM layer partially inserted therein.

FIG. 13A shows a partial perspective view of the generator in FIG. 13 with the VCM layer and the stator coil 1304 partially inserted inside the electromagnet coil 1303. FIG. 13B shows a side view of the electromagnet coil 1303, the stator coil 1304 and the VCM layer 1310. Similar to the embodiment in FIG. 12, the stator windings are shown to be different from the windings of the electromagnet coil. In other embodiments, the stator windings may have the same as or less than the windings of the electromagnet coil.

In some embodiments, a casing may be used to retain the magnetic field. This is similar to what is used in transformers. Such casing may be used with any of the embodiment described in this disclosure. In the embodiment where the stator is located outside the electromagnet, the casing may be placed over the stator layer. In embodiments where the stator is positioned inside the electromagnet, the casing may be placed outside the electromagnet coil.

A method of operating any of the embodiments above will now be described. In such method, an electromagnet is provided at the rotor side of an induction generator. A stator comprising windings is also provided, in which the stator is positioned inside the magnetic field of the electromagnet and is intersected by the magnetic field lines of the electromagnet. In some embodiments, the stator is external to and in close proximity of at least sections of the electromagnet corresponding to the north and south poles. In other embodiments, where the electromagnet is a hollow solenoid, the stator is positioned inside the electromagnet. The method further includes the step of fixing the position and configuration of the electromagnet to be stationary in relation to the stator. The stator is configured such that the orientation of the stator windings to the magnetic field lines causes the angle between the magnetic field lines and the normal to the surface of the stator winding to be zero, thus maximizing the surface area of exposure to the magnetic field lines at all times. The method also includes providing a modulator that is used to control and change the frequency of the electrical current of the power supply that is used to power the electromagnet. Given the direct proportionality relationship between the magnetic flux, magnetic field and current established in equations (3), (5) and (7) to (9) above, an EMF is induced in the windings of the stator as a result of the modulator changing the rate of the electrical current applied to the electromagnet.

The system and method above describe different embodiments of a new induction generator and method of operating same. It is to be understood that the scope of this disclosure also covers systems and method in which a hybrid system is used. Specifically, it is contemplated that any system in which stationary magnets and stators are used on a temporary basis in an induction generator are to be covered as part of the current invention.

In this application, reference is made to the rotor section of an induction generator. However, as stated above, the electromagnet in such section is held stationary. As such, it is to be understood that reference to rotors in this disclosure is simply to provide a comparison to elements of existing technology. It is to be considered exemplary and not limiting. In fact, any reference to rotors in this disclosure may be understood to reference a central section of an induction generator. Any reference to stators in this disclosure may also be understood to reference sections comprising coil windings. Such stators may be external to the central section and in close proximity to the surface of the magnetic poles formed on such section or in some embodiments, may be internal to the electromagnet when the electromagnet is a hollow solenoid.

The current disclosure describes a new induction generator and method of operating same. However, it is to be understood that the scope of this invention also covers modifying existing induction generators to increase the efficiency of such generators. The method for modifying the induction generators to increase its efficiency in generating electricity includes the steps of fixing the rotor and the electromagnet therein stationary in relation to the stator of the induction generator; removing or disabling the rotating shaft that is traditionally used to rotate the rotor of the induction generator; and modulating the electrical current supplied to the electromagnet to power it such that there is a rapid rate of change in the current supplied to the electromagnet. The result of this modification is the induction of EMF at the stator windings as a result of the rapid change of current supplied to the electromagnet without the need for moving.

Thus, in accordance with the system and method described in the present invention, the new induction generator advantageously provides improved efficiency in electricity generation using induction and reduces environmental damage by eliminating the need for a fuel source to power sections of the traditional induction generator. Further, eliminating the shaft, turbine and all components of the traditional system that are required to power the turbine and the shaft, reduces maintenance costs and the chance of off time due to failure of parts. Additionally, it reduces tremendously the detrimental environmental effects of present production of electricity by using Hydrocarbons, etc.

Interpretation of Terms

Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

"power source" and "power supply" refer to any source of electrical power in a form that is suitable for operating electronic circuits.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", "upper", "lower" and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

Where a component (e.g. a circuit, module, assembly, device, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of device and method have been described herein for purposes of illustration. These are only examples. The technology provided herein can be applied to device and method other than the examples described above. Many alterations, modifications, additions, omissions and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

It is therefore intended that the following appended claims and claims hereafter introduced are interpreted to include all such modifications, permutations, additions, omissions and sub-combinations as may reasonably be inferred. The scope of the claims should not be limited by the preferred embodiments set forth in the examples, but should be given the broadest interpretation consistent with the description as a whole.

What is claimed is:

1. An induction power generating system comprising:
at least one stationary electromagnet receiving an excitation voltage from a power supply; the at least one stationary electromagnet having a north pole, a south pole and a magnetic field;
at least one stationary coil positioned inside the magnetic field of the at least one stationary electromagnet and intersected by magnetic field lines of the magnetic field;
wherein the power supply is configured for modifying a rate of change of an electrical current supplied from the power supply to the at least one stationary electromagnet, such that when the at least one stationary electromagnet is excited by the power supply, an electromotive force (EMF) is induced in the at least one stationary coil and wherein the at least one stationary coil and the at least one stationary electromagnet are stationary at all times and in relation to one another throughout the entire operation of the system.

2. The induction power generating system according to claim 1, the system further comprising a modulator for modifying the rate of change of the electrical current supplied from the power supply to the at least one stationary electromagnet, such that when the at least one stationary electromagnet is excited by the modulator-controlled power supply, an electromotive force (EMF) is induced in the at least one stationary coil generating an induced current.

3. The induction power generating system according to claim 1, wherein the at least one stationary electromagnet comprises two or more electromagnets and wherein external to and in close proximity of each of the north pole and the south pole of each of the two or more electromagnets is at least one stational coil.

4. The induction power generating system according to claim 1, wherein the power supply is one of a Direct-current or Alternating-current voltage power supply.

5. The induction power generating system according to claim 2, wherein the modulator is configured to modify the rate of change of the electrical current by applying to an electrical current signal of the power supply one or more modulation signals including pulse waves, square waves, triangular waves, triangular pulses, sinusoidal waves and sawtooth waves.

6. The induction power generating system according to claim 1, wherein the at least one stationary coil is configured such that an angle between the magnetic field lines and a normal direction to the surface of the at least one stationary coil intersected by the magnetic field lines is zero.

7. The induction power generating system according to claim 1, wherein the at least one stationary electromagnet is configured such that the north pole and the south pole are shaped to maximize their surface areas, the north pole and the south pole are separated by material to prevent the magnetic field lines from moving from the north pole to the south pole internal to the surface areas of the north pole and south pole, and wherein the at least one stationary coil comprises a series of coils positioned adjacent to one another to cover the entire surface area of at least one of the north pole and the south pole.

8. The induction power generating system according to claim 7, wherein the material is non-magnetic material.

9. The induction power generating system according to claim 1, wherein the at least one stationary coil is positioned externally to and in close proximity of at least one of the north pole and the south pole of the at least one stationary electromagnet.

10. The induction power generating system according to claim 1, wherein the at least one stationary electromagnet is a hollow solenoid and the at least one stationary coil is positioned inside the at least one stationary electromagnet.

11. A method for generating electricity using magnetic induction, the method comprising:
powering a stationary electromagnet using a power supply;
modifying a rate of change of an electrical current supplied from the power supply to the stationary electromagnet; and
inducing an electrical current on at least one stationary coil positioned inside a magnetic field of the stationary electromagnet and intersected by magnetic field lines of the magnetic field, the induction occurring when the at least one stationary electromagnet is excited by the power supply, wherein the at least one stationary electromagnet and the at least one stationary coil are maintained stationary at all times and in relation to one another throughout the method of generating electricity.

12. A method of modifying a traditional induction generator to increase output efficiency, the method comprising:
fixing a rotor and an electromagnet therein of the traditional induction generator stationary in relation to a stator of the traditional induction generator;
disabling any rotational movement of the rotor and removing any system component contributing to such movement; and
applying a modulated current to the electromagnet on the stationary rotor to generate a rapid rate of change in the modulated electrical current supplied to the electromagnet, and
inducing an Electromotive force (EMF) and a current on winding of the stator due to the rapid rate of change of the modulated electrical current.

* * * * *